(12) United States Patent
Komori et al.

(10) Patent No.: US 9,243,327 B2
(45) Date of Patent: Jan. 26, 2016

(54) PLASMA CVD DEVICE AND METHOD OF MANUFACTURING SILICON THIN FILM

(75) Inventors: Tsunenori Komori, Otsu (JP); Takao Amioka, Otsu (JP); Keitaro Sakamoto, Otsu (JP)

(73) Assignee: Toray Industries, Inc., Tokyo (JP)

( * ) Notice: Subject to any disclaimer, the term of this patent is extended or adjusted under 35 U.S.C. 154(b) by 709 days.

(21) Appl. No.: 13/505,156

(22) PCT Filed: Oct. 21, 2010

(86) PCT No.: PCT/JP2010/068557
§ 371 (c)(1),
(2), (4) Date: Apr. 30, 2012

(87) PCT Pub. No.: WO2011/052463
PCT Pub. Date: May 5, 2011

(65) Prior Publication Data
US 2012/0220109 A1    Aug. 30, 2012

(30) Foreign Application Priority Data
Nov. 2, 2009 (JP) ................... 2009-251656

(51) Int. Cl.
*C23C 16/00* (2006.01)
*C23C 16/455* (2006.01)
(Continued)

(52) U.S. Cl.
CPC ........... *C23C 16/45591* (2013.01); *C23C 16/24* (2013.01); *C23C 16/4401* (2013.01);
(Continued)

(58) Field of Classification Search
CPC .................. C23C 16/4401; C23C 16/4412
See application file for complete search history.

(56) References Cited

U.S. PATENT DOCUMENTS 4,209,357 A * 6/1980 Gorin et al. .................. 438/710
8,431,996 B2 * 4/2013 Sakamoto et al. ............ 257/350
(Continued)

FOREIGN PATENT DOCUMENTS

JP   06-124906 A   5/1994
JP   06-291064 A   10/1994
(Continued)

OTHER PUBLICATIONS

Madoka Takai et al., Applied Physics Letters, vol. 77, No. 18, Oct. 30, 2000, pp. 2828-2830.
(Continued)

*Primary Examiner* — Gordon R Baldwin
*Assistant Examiner* — Charlee Bennett
(74) *Attorney, Agent, or Firm* — RatnerPrestia

(57) ABSTRACT

A plasma CVD device comprises a vacuum vessel that houses a discharge electrode plate and a ground electrode plate to which is attached a substrate for thin film formation. The plasma CVD device has an earth cover at an interval from and facing the aforementioned discharge electrode plate; the aforementioned discharge electrode plate has gas inlets and exhaust outlets (which expel gas introduced through said gas inlets) that are connected at one end to equipment supplying raw gas for thin film formation and that open at the other end at the bottom face of the aforementioned discharge electrode plate; the aforementioned earth cover has second gas inlets corresponding to the aforementioned gas inlets, and second exhaust outlets corresponding to the aforementioned exhaust outlets. The plasma CVD device has an electric potential control plate disposed at an interval from and facing the aforementioned ground cover.

9 Claims, 5 Drawing Sheets

(51) Int. Cl.
    *C23C 16/24*    (2006.01)
    *C23C 16/44*    (2006.01)
    *C23C 16/509*   (2006.01)
    *C23C 16/52*    (2006.01)
    *H01J 37/32*    (2006.01)
    *H01L 21/02*    (2006.01)

(52) U.S. Cl.
    CPC ....... *C23C16/4412* (2013.01); *C23C 16/45565* (2013.01); *C23C 16/5096* (2013.01); *C23C 16/52* (2013.01); *H01J 37/32091* (2013.01); *H01J 37/32834* (2013.01); *H01L 21/0262* (2013.01); *H01L 21/02532* (2013.01)

(56) References Cited

U.S. PATENT DOCUMENTS

| | | | |
|---|---|---|---|
| 8,910,591 B2 * | 12/2014 | Kiehlbauch | 118/723 E |
| 2005/0145170 A1 * | 7/2005 | Matsubara et al. | 118/715 |

FOREIGN PATENT DOCUMENTS

| | | |
|---|---|---|
| JP | 08-091987    | 4/1996 |
| JP | 09-223685 A  | 8/1997 |
| JP | 09-283498 A  | 10/1997 |
| JP | 2001-011640 A | 1/2001 |
| JP | 2002-289530  | 10/2002 |
| JP | 2002-299266  | 10/2002 |
| JP | 2005-244098 A | 9/2005 |
| JP | 2007-214296  | 8/2007 |
| WO | WO 2010110099 A1 * | 9/2010 |

OTHER PUBLICATIONS

Satoshi Shimizu et al., Journal of Applied Physics, 101, 064911, (2007), pp. 1-5.

International Search Report dated Nov. 22, 2010, application No. PCT/JP2010/068557.

* cited by examiner

PLASMA CVD DEVICE AND METHOD OF MANUFACTURING SILICON THIN FILM

CROSS-REFERENCE TO RELATED APPLICATIONS

This application is the U.S. National Phase application of PCT International Application No. PCT/JP2010/068557, filed Oct. 21, 2010, and claims priority to Japanese Patent Application No. 2009-251656, filed Nov. 2, 2009, the disclosures of which PCT and priority applications are incorporated herein by reference in their entireties for all purposes.

FIELD OF THE INVENTION

The present invention relates to a plasma CVD device (plasma chemical vapor deposition device), and a method of manufacturing a silicon thin film using a plasma CVD method. In particular, the invention relates to a plasma CVD device for forming a silicon thin film used for thin film silicon solar cells, thin film silicon transistors, etc., and a method of manufacturing a silicon thin film by using a plasma CVD method.

BACKGROUND OF THE INVENTION

Compared with single-crystalline silicon solar cells and multi-crystalline silicon solar cells mainly used as solar cells, thin film silicon solar cells attract attention as solar cells of the next generation since they are advantageous in view of cost without using expensive silicon substrates.

As a method of manufacturing an amorphous silicon thin film used for thin film silicon solar cells, a manufacturing method using a parallel-plates type plasma CVD device is known. A conventional parallel-plates type plasma CVD device used in this manufacturing method is shown in FIG. 7.

The conventional parallel-plates type plasma CVD device 61 shown in FIG. 7 has a vacuum vessel 62 for performing plasma treatment. The vacuum vessel 62 usually has exhaust ports 62a to be connected with a high-vacuum exhaust equipment and a process exhaust equipment. The high-vacuum exhaust equipment is used to obtain the back pressure inside the vacuum vessel 62, and as the high-vacuum exhaust equipment, usually a turbo molecular pump or the like is used. The process exhaust equipment is used to maintain the pressure required in a plasma treatment process, and in the case of a general CVD process, as the process exhaust equipment, a mechanical booster pump or the like is used, though depending on the process pressure.

Inside the vacuum vessel 62, a discharge electrode plate 63 and an earth electrode plate 610 are installed to face each other with a clearance therebetween. On the upper surface of the earth electrode plate 610, a substrate 612 is held. The earth electrode plate 610 is internally provided with a heating mechanism 611 for heating the substrate 612.

At the lower face of the discharge electrode plate 63, a hollow portion 63a is provided, and a shower plate 66 is installed at the lower face of the discharge electrode plate 63, to close the hollow portion 63a. In the shower plate 66, numerous gas introduction holes 66a are provided therethrough from the upper surface to the lower surface of the shower plate 66. The vacuum vessel 62 is provided with a raw gas supply pipe 65 extending from a gas supply equipment (not shown in the drawing) installed outside the vacuum vessel 62 and passing through the discharge electrode plate 63, to reach the hollow portion 63a.

The raw gas supply pipe 65 is electrically insulated from the discharge electrode plate 63 though not shown in the drawing. The vacuum vessel 62 is also electrically insulated from the discharge electrode plate 63 though not shown in the drawing. The vacuum vessel 62 is earthed by a conductor 62c. Between the vacuum vessel 62 and the earth electrode plate 610, an insulator 610a is provided, and the earth electrode plate 610 is earthed by a conductor 610c.

Raw gas necessary for plasma treatment is supplied from the raw gas supply equipment through the raw gas supply pipe 65 into the hollow portion 63a. The gas supplied into the hollow portion 63a passes through the numerous gas introduction holes 66a of the shower plate 66 and is uniformly supplied to the substrate 612 held on the earth electrode plate 610.

A high frequency power supply 614 is connected with the discharge electrode plate 63 via a matching box 613. The exhaust equipment keeps the inside of the vacuum vessel 62 at a constant pressure, and a high frequency power is applied to the discharge electrode plate 63 by the high frequency power supply 614, to generate plasma. Generated plasma forms an amorphous silicon thin film on the surface of the substrate 612.

However, it is known that if the amorphous silicon thin film produced by using such a parallel-plates type plasma CVD device is irradiated with light, dangling bonds (defects) increase in the film, to cause light-induced degradation. The problem of light-induced degradation was found as the Staeber-Wronski effect more than 30 years ago, but is not yet solved.

The mechanism in which the light-induced degradation is caused is not yet clearly clarified. However, it is known that the light-induced degradation has correlation with a Si—$H_2$ bond concentration in the film. Further, it is reported that if the Si—$H_2$ bond concentration in the film is low, the light-induced degradation is also small. It is indicated as a cause of the increase in the Si—$H_2$ bond concentration that high order silane-related species ($Si_mH_n$: m=2 or more) growing during formation of the film are incorporated into the film. It is considered that the high order silane-related species grow due to the successive reaction in which the $SiH_2$ radicals produced in the plasma are inserted into Si—H bonds, and are mixed into the film, to increase the Si—$H_2$ bonds, causing initial dangling bonds to be formed in the film.

On the other hand, the reactions in the plasma start when electrons having some energy collide with $SiH_4$ acting as parent molecules, to decompose them into various molecules such as $SiH_3$ radicals and $SiH_2$ radicals. In general, the electron temperatures (Te) showing energy of electrons in the plasma have a distribution, and in addition to the $SiH_3$ radicals as a precursor contributing to creation of the film, $SiH_2$ radicals are produced without fail. For this reason, in the case where the conventional parallel-plates type plasma CVD device is used to manufacture an amorphous silicon thin film, the power applied is set at a low level in order to decrease the generation of high order silane-related species, for thereby inhibiting the generation of $SiH_2$ radicals and high order silane-related species. However, because of the low power level, the depositing rate cannot be enhanced (Non Patent Literature 1).

On the other hand, as a film deposition method for obtaining an amorphous silicon thin film with a low Si—$H_2$ bond concentration, a triode deposition system is proposed. A plasma CVD device using the triode deposition system is shown in FIG. 8. The plasma CVD device 71 using the triode deposition system shown in FIG. 8 is identical to the plasma CVD device 61 shown in FIG. 7 in basic structure. Accordingly the same components as those of FIG. 7 are indicated by the same symbols in FIG. 8. The difference between the device 71 of FIG. 8 and the device 61 of FIG. 7 is that a mesh electrode plate 716 is installed between the discharge electrode plate 63 and the earth electrode plate 610.

In FIG. 8, a DC variable power supply 715 is connected with the mesh electrode plate 716. As can be seen from FIG. 8, the triode deposition system also uses a parallel-plates type CVD device. The mesh electrode plate 716 is inserted between the discharge electrode plate 63 and the earth electrode plate 610, and a potential (usually a negative potential) is applied to the mesh electrode plate 716. Thus, it is considered that the plasma can be contained between the discharge electrode plate 63 and the mesh electrode plate 716. No plasma is generated between the mesh electrode plate 716 and the earth electrode plate 610. On the other hand, the radicals contributing to creation of the film are produced between the discharge electrode plate 63 and the mesh electrode plate 716 and diffused by the mesh electrode plate 716, to reach the substrate 612.

The diffusion distance of radicals is proportional to the square root of the inverse number of the molecular weight. Therefore, it is intended to use that the diffusion distance of high order silane-related radicals is shorter than that of $SiH_3$ radicals, in order to selectively transport the $SiH_3$ radicals to the substrate 612.

With this configuration, a very low Si—$H_2$ bond concentration can be achieved to obtain an amorphous silicon thin film having a low light-induced degradation rate. However, in order to remove high order silane-related radicals in the triode deposition system, it is necessary that the distance between the mesh electrode plate 716 and the earth electrode plate 610 is long enough. For this reason, the triode deposition system has a problem that the depositing rate cannot be enhanced (Non Patent Literature 2).

Further, the gas temperature in the plasma is also an important factor. It is known that the successive reaction for growing high order silane-related species ($Si_mH_n$: m=2 or more) is a third-body reaction. As a means for inhibiting this reaction, gas heating is considered effective. The high order silane-related species produced by the insertion reaction of $SiH_2$ radicals into Si—H bonds are stabilized by making a third body (usually $SiH_4$ acting as parent molecules) absorb extra energy.

Consequently in the state where the third body is not in a position to accept energy, that is, in the state where the temperature is high, the third-body reaction does not take place, and high order silane-related species are inhibited (Patent Literature 1). Therefore, in order to heat the space for depositing the film, it is desirable that the plasma near the sheath on the discharge electrode plate side where the high order silane-related species are considered to be most generated is heated from the discharge electrode plate side. However, it is structurally difficult to apply a high frequency to the electrode plate and further to introduce a heater. Usually in order to control the substrate temperature, the earth electrode plate supporting the substrate is heated. This causes also the plasma to be heated via the substrate, but since the place is distant from the sheath on the discharge electrode plate side, the state of effective and positive heating cannot be achieved. Accordingly if the substrate temperature is further raised to higher than the optimum substrate temperature, defects in the film increase. Therefore, there is a problem that the highest heating temperature is limited.

Patent Literature

Patent Literature 1: JP 08-91987 A

Non Patent Literature

Non Patent Literature 1: Madoka Takai et al., APPLIED PHYSICS LETTERS 77 (2000) 2828
Non Patent Literature 2: Satoshi Shimizu et al., JOURNAL OF APPLIED PHYSICS 101, 064911, (2007)

SUMMARY OF THE INVENTION

As described above, in order to inhibit the light-induced degradation of thin film silicon solar cells, hitherto, attempts have been made to decrease the ingress of high order silane-related species into the amorphous silicon thin film, for thereby lowering the Si—$H_2$ bond concentration in the film as fax as possible. However, these attempts do not suit the manufacturing of solar cells due to very low depositing rates and high depositing temperatures. That is, any practical method for depositing a film, which ensures both a high depositing rate and a low Si—$H_2$ bond concentration in the film, has not been found yet.

Embodiments of the invention provide a plasma CVD device capable of manufacturing an amorphous silicon thin film having a low Si—$H_2$ bond concentration therein at a high depositing rate and at a low depositing temperature, and also provide a method of manufacturing a silicon thin film by using the plasma CVD device.

An embodiment of a plasma CVD device of the invention is as follows:

A plasma CVD device provided with (comprising or consisting of):

(a) a vacuum vessel,
(b) an exhaust equipment for keeping the inside of the vacuum vessel under reduced pressure,
(c) a discharge electrode plate installed in the vacuum vessel,
(d) an earth electrode plate for supporting a substrate for forming a thin film thereon, installed to face the discharge electrode plate with a clearance kept therefrom,
(e) a high frequency power supply for applying a high frequency power to the discharge electrode plate, and
(f) a raw gas supply equipment for supplying a raw gas for forming the thin film into the vacuum vessel, which comprises
(g) a plurality of gas introduction holes formed in the discharge electrode plate, connected on one side with the gas supply equipment and opening on the other side at plural places on one surface of the discharge electrode plate, and a plurality of gas exhaust holes formed in the discharge electrode plate and passing therethrough from the surface where the plurality of gas introduction holes open, to the surface of the other side,
(h) a gas exhaust equipment for exhausting the gas exhausted from the plurality of gas exhaust holes to outside the vacuum vessel,
(i) an earth cover plate installed between the discharge electrode plate and the earth electrode plate with clearances kept from the respective electrode plates, and
(j) a plurality of second gas introduction holes formed through the earth cover plate at the positions in the earth cover plate corresponding to the plurality of gas introduction holes and a plurality of second gas exhaust holes formed through the earth cover plate at the positions in the earth cover plate corresponding to the plurality of exhaust holes.

In embodiments of the plasma CVD device of the invention, it is preferred that the diameter of the gas exhaust holes is 2 mm to 100 mm.

In embodiments of the plasma CVD device of the invention, it is preferred that the clearance between the discharge electrode plate and the earth cover plate is 0.5 mm to 10 mm.

In embodiments of the plasma CVD device of the invention, it is preferred that the diameter of the second gas exhaust holes is 0.5 to 1.5 times the diameter of the gas exhaust holes.

In embodiments of the plasma CVD device of the invention, it is preferred that the diameter of the second gas introduction holes is 7 mm or less in so far as the flow of the gas in the second introduction holes is not prevented.

In embodiments of the plasma CVD device of the invention, it is preferred that the earth cover plate is earthed.

In embodiments of the plasma CVD device of the invention, it is preferred that the earth cover plate is provided with a heating mechanism.

In embodiments of the plasma CVD device of the invention, it is preferred that a potential control plate capable of controlling the potential is installed between the earth cover plate and the earth electrode plate with clearances kept from the respective plates, and that a plurality of third gas introduction holes positioned in correspondence to the plurality of second gas introduction holes and a plurality of third gas exhaust holes positioned in correspondence to the plurality of second gas exhaust holes are formed in the potential control plate, to pass through the potential control plate.

In embodiments of the plasma CVD device of the invention, it is preferred that the potential applied to the potential control plate is a negative potential.

An embodiment of a method of manufacturing a silicon thin film of the invention is as follows.

A method of manufacturing a silicon thin film comprises the steps of plasmatizing a raw gas containing a Si compound by using the plasma CVD device of the invention, making the earth electrode plate for supporting a substrate for forming a thin film thereon support the substrate for forming a thin film thereon, and depositing a silicon thin film on the substrate.

The invention provides embodiments of a plasma CVD device capable of manufacturing a high quality amorphous silicon thin film having few defects and little ingress of high order silane-related species by controlling flow of a gas introduced into a vacuum vessel and controlling plasma for removing high order silane-related species and further by controlling a gas temperature separately from a substrate temperature, and also provides embodiments of a method of manufacturing a high quality amorphous silicon thin film.

DETAILED DESCRIPTION OF THE INVENTION

Figure 1:
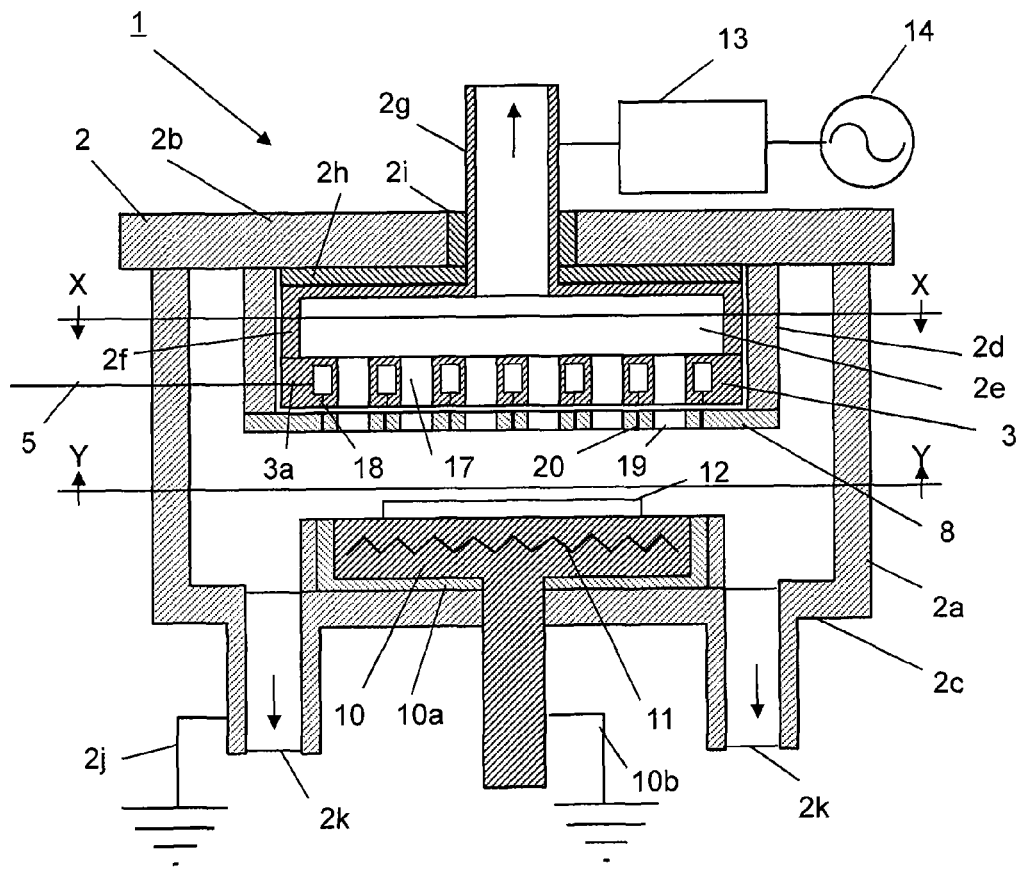
FIG. 1 is a schematic vertical sectional view showing an embodiment (first embodiment) of the plasma CVD device of the invention.

A first embodiment is described below.

FIGS. 1 to 4 show an example of a first embodiment of the plasma CVD device of the invention. The plasma CVD device 1 has a vacuum vessel 2. The vacuum vessel 2 is formed by side plate 2a, a top plate 2b closing the opening at the top plane of the side plate 2a, and a bottom plate 2c closing the opening at the bottom plane of the side wall 2a. The vacuum vessel 2 has interior side plate 2d attached to the lower surface of the top plate 2b. In the space inside the interior side plate 2d, a gas exhaust cap 2f having a hollow portion 2e and open at the bottom plane is installed, and a portion (preferably a central portion) of the top plate of the gas exhaust cap 2f is guided outward from the vacuum vessel 2, forming a gas exhaust conduit (gas exhaust equipment) 2g.

Figure 3:
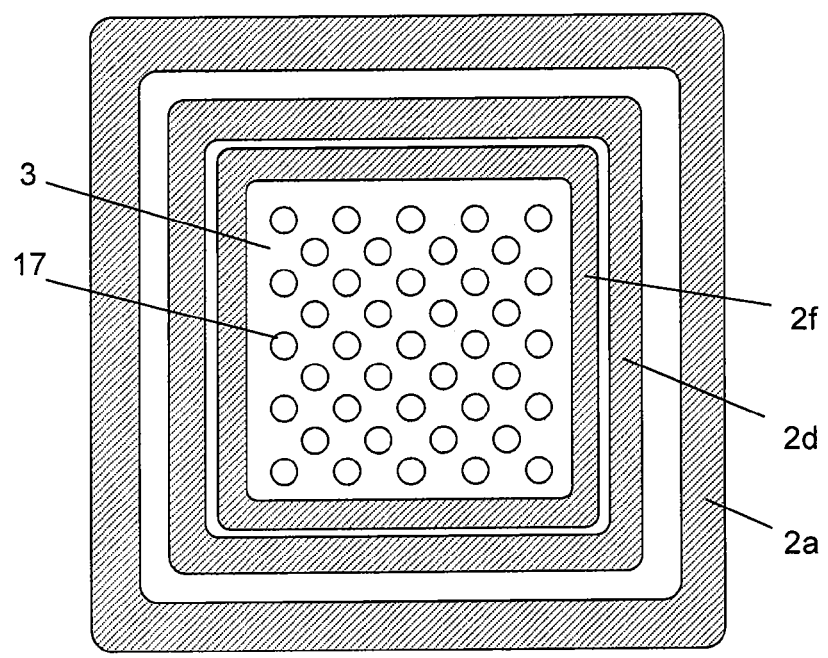
FIG. 3 is a plan view taken in the direction of the arrows along the line X-X in FIG. 1.
Figure 4:
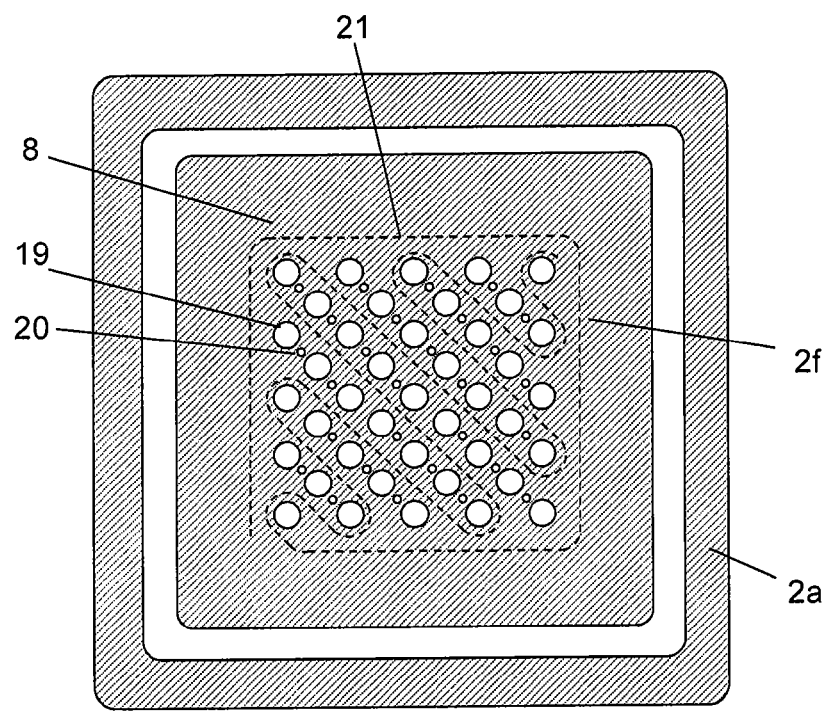
FIG. 4 is a plan view taken in the direction of the arrows along the line Y-Y in FIG. 1.

At the bottom plane of the gas exhaust cap 2f, a discharge electrode plate 3 is installed to close the opening of the hollow portion 2e. The discharge electrode plate 3 has a raw gas supply hole 3a therein and numerous gas introduction holes 18 opening at the lower surface of the discharge electrode plate 3, which branch from the raw gas supply hole 3a. The discharge electrode plate 3 has numerous gas exhaust holes 17 passing therethrough from the surface where the numerous gas introduction holes 18 open, to the surface of the other side, i.e., from the lower surface to the upper surface. The numerous gas introduction holes 18 and the numerous gas exhaust holes 17 are formed at the positions different from each other. Being numerous in this case is intended to mean that the raw gas can flow almost uniformly in the vacuum vessel 2. An example of the arrangement of the numerous gas exhaust holes 17 in the discharge electrode plate 3 is shown in FIGS. 3 and 4 as plan views.

The upstream side of the raw gas supply hole 3a is connected with a raw gas supply pipe 5 extending outward from the vacuum vessel 2. The upstream side of the raw gas supply pipe 5 is connected with a raw gas supply source not shown in the drawing.

Figure 2:
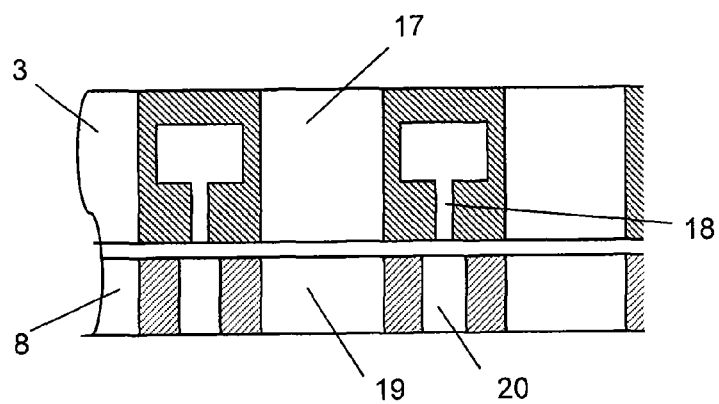
FIG. 2 is a partially enlarged vertical sectional view showing the discharge electrode plate and the earth cover plate of the plasma CVD device shown in FIG. 1.

At the bottom plane of the interior side plate 2d, an earth cover plate 8 is attached to cover the inside space of the interior side plate 2d. The upper surface of the earth cover 8 faces the lower surface of the discharge electrode plate 3 with a clearance kept therebetween. The earth cover plate 8 has numerous second gas introduction holes 20 formed at the positions corresponding to the gas introduction holes 18 of the discharge electrode plate 3, and numerous second gas exhaust holes 19 formed at the positions corresponding to the gas exhaust holes 17 of the discharge electrode plate 3. Both the second gas introduction holes 20 and the second gas exhaust holes 19 pass through the earth cover plate 8 in the thickness direction thereof. An enlarged view showing an example of the positional relation between the gas introduction holes 18 and the gas exhaust holes 17 of the discharge electrode plate 3 on one hand and the second gas introduction holes 20 and the second gas exhaust holes 19 of the earth cover plate 8 on the other hand is shown in FIG. 2.

Between the inner wall face of the interior side plate 2d on one hand and the side wall face of the discharge electrode plate 3 and the side wall face of the gas exhaust cap 2f on the other hand, space is formed for preventing the electric conduction between those components.

The discharge electrode plate 3 and the gas exhaust cap 2f are formed of an electric conductor. The gas exhaust cap 2f is connected with a high frequency power supply 14 in the portion of the gas exhaust conduit 2g. Between the high frequency power supply 14 and the gas exhaust cap 2f, if necessary, a matching box 13 is provided. Between the gas exhaust cap 2f and the top plate 2b of the vacuum vessel 2, electric insulators 2h and 2i are provided. The vacuum vessel 2 is earthed by a conductor 2j.

The interior side plate 2a and the earth cover plate 8 are formed of an electric conductor. The earth cover plate 8 is also earthed by the conductor 2j via the interior side plate 2a, and the top plate 2b, side plate 2a and bottom plate 2c of the vacuum vessel 2.

Inside the vacuum vessel 2, at a portion (preferably at a central portion) on the upper surface of the bottom plate 2c of the vacuum vessel 2, an earth electrode plate 10 is installed via an electric insulator 10a. A portion (preferably a central portion) of the lower surface of the earth electrode plate 10 is guided outward from the vacuum vessel 2 and earthed by a conductor 10b. On the upper surface of the earth electrode plate 10, a substrate 12 for forming a thin film thereon is mounted. Inside the earth electrode plate 10, if necessary, a substrate heating mechanism 11 is installed.

The bottom plate 2c of the vacuum vessel 2 is provided with exhaust ports 2k for exhausting gas in the vacuum vessel 2. The exhaust ports 2k are connected with a high vacuum exhaust equipment (not shown in the drawing) and a process exhaust equipment (not shown in the drawing). The high vacuum exhaust equipment is provided to obtain the back pressure inside the vacuum vessel 2, and as the high vacuum exhaust equipment, a turbo molecule pump or the like is used. The process exhaust equipment is provided to maintain the pressure necessary for the plasma treatment process, and as the process exhaust equipment, a mechanical booster pump, turbo molecule pump or the like is used.

The frequency of the high frequency power supply 14 can be selected as desired. It is considered that if the frequency is higher, the electron temperature declines. In view of productivity and the uniformity of the produced thin film, it is preferred that the frequency used is 100 kHz to 100 MHz. A more preferred range is 10 MHz to 60 MHz.

The substrate 12 for forming a thin film thereon is mounted on the earth electrode plate 10. For example, the earth electrode plate 10 can be counter-sunk, and the substrate 12 can be placed in the counter-sunk portion. Otherwise, another fixture may also be used to press the substrate 12 onto the earth electrode plate 10 for mounting.

The gas exhaust holes 17 formed in the discharge electrode plate 3 function to make gas flow from the lower surface side to the upper surface side of the discharge electrode plate 3, to ensure that the gas reaching the hollow portion 2e may be exhausted from the gas exhaust conduit 2g to outside the vacuum vessel 2. In addition, the gas exhaust holes 17 also function to localize the plasma therein. Consequently it is important to design the diameter of the gas exhaust holes in response to the pressure for depositing the film.

That is, in the case where the pressure for depositing the film is low, gas exhaust holes having a large diameter are used, and in the case where the pressure for depositing the film is high, gas exhaust holes having a small diameter are used. On the other hand, if the diameter of the gas exhaust holes 17 is too small, sufficient gas exhaust capability may not be obtained or it may be difficult to manufacture the discharge electrode plate 3 by machining.

Further, if the diameter of the gas exhaust holes 17 is too large, there may occur a problem that the film thickness distribution of the thin film formed on the substrate 12 may not be uniform. It is preferred that the diameter of the gas exhaust holes 17 is 2 mm to 100 mm. A more preferred range is 5 mm to 50 mm. As shown in FIGS. 3 and 4, it is preferred that the numerous gas exhaust holes 17 are arranged uniformly in the discharge electrode plate 3.

Exhaust of gas in the vacuum vessel 2 while the thin film is formed on the substrate 12 may be performed through the gas exhaust conduit 2g from the gas exhaust holes 17 formed in the discharge electrode plate 3, but in addition can also be performed through the exhaust ports 2k formed in the vacuum vessel 2 while the pressure in the vacuum vessel 2 is adjusted.

While the flow rate of the raw gas is controlled by a mass flow controller not shown in the drawing, the raw gas is introduced into the chamber of the vacuum vessel 2 through the raw gas supply pipe 5, the raw gas supply hole 3a and the numerous gas introduction holes 18.

As the raw gas, in general, silane ($SiH_4$) is used, but such a gas as a halide or disilane can also be used. The raw gas can also be diluted by hydrogen or an inert gas such as argon. A doping gas can also be introduced into the raw gas.

It is preferred that the clearance between the discharge electrode plate 3 and the earth cover plate 8 is set at such a clearance as not to cause discharge between the discharge electrode plate 3 and the earth cover plate 8. It is preferred that the clearance is 0.5 mm to 10 mm, and a more preferred range is 0.5 mm to 5 mm.

The numerous second gas introduction holes 20 and the numerous second gas exhaust holes 19 formed in the earth cover plate 8 and the numerous gas introduction holes 18 and the numerous gas exhaust holes 17 formed in the discharge electrode plate 3 are positioned to face each other in such a state as not to block the openings of the other plate.

If the diameter of the second gas exhaust holes 19 of the earth cover plate 8 is too larger than the diameter of the gas exhaust holes 17 of the discharge electrode plate 3, plasma leak may be caused. On the other hand, if the former is too smaller than the latter, the deposition rate capable of inhibiting the diffusion of active species from the plasma declines. It is preferred that the diameter of the second gas exhaust holes 19 of the earth cover plate 8 is 0.5 to 1.5 times the diameter of the gas exhaust holes 17 of the discharge electrode plate 3. The form of the second gas exhaust holes 19 of the earth cover plate 8 can also be such a form as to change in diameter in the hole axis direction, for example, a tapered form.

It is preferred that the diameter of the second gas introduction holes 20 of the earth cover plate 8 formed to face the gas introduction holes 18 of the discharge electrode plate 3 is such a size as not to prevent flow of gas through the second gas introduction holes 20 from the upper surface side to the lower surface side of the earth cover plate 8 and such a size as not to allow the plasma to enter the second gas introduction holes 20. It is preferred that the diameter of the second gas introduction holes 20 of the earth cover plate 8 is 7 mm or less. More preferred is 2 mm or less.

If the earth cover plate 8 having such second gas introduction holes 20 and such second gas exhaust holes 19 is installed to face the discharge electrode plate 3 with a clearance kept therebetween, the plasma can be confined inside the gas exhaust holes 17 formed in the discharge electrode plate 3 and the second gas exhaust holes 19 formed in the earth cover plate 8. The earth cover plate 8 can be electrically shielded or can also have a potential applied thereto. However, considering the stability of discharge, it is preferred that the earth cover plate 8 is earthed.

If the plasma is confined in the gas exhaust holes 17 and the second gas exhaust holes 19 as described above, the plasma remains to exist in gas flow in these holes. Therefore, the high order silane-related species short in diffusion length are exhausted through these holes by gas flow in these holes, and on the other hand, the $SiH_3$ radicals long in diffusion length are diffused in the direction toward the substrate 12 by diffusion.

Further, if the plasma is confined inside the gas exhaust holes 17 of the discharge electrode plate 3 and the second gas exhaust holes 19 of the earth cover plate 8, the plasma between the earth cover plate 8 and the substrate 12 is weakened, and few new active species exist in the space between the earth cover plate 8 and the substrate 12. As a result, a state where only the high order silane-related species, $SiH_2$ radicals and $SiH_3$ radicals respectively contributing to deposition of the film are diffused from the earth cover plate 8 toward the substrate 12 is formed.

The following reactions are considered to occur in the space between the earth cover plate 8 and the substrate 12.

$$Si_mH_{2m+1} + SiH_4 \rightarrow Si_mH_{2m+2} + SiH_3 \quad \text{(Formula 1)}$$

$$SiH_2 + SiH_4 \rightarrow Si_2H_6 \quad \text{(Formula 2)}$$

$$SiH_3 + SiH_4 \rightarrow SiH_4 + SiH_3 \quad \text{(Formula 3)}$$

Formula 1 indicates that the high order silane-related radicals diffused in the direction toward the substrate 12 against flow of gas in the exhaust direction react with $SiH_4$ acting as parent molecules during the diffusion toward the substrate 12, to produce inactive high order silane-related species, being exhausted without participating in the deposition of the film. Formula 2 indicates that $SiH_2$ radicals react with $SiH_4$ acting as parent molecules, to be inactive in the process of growing into high order silane-related species while being diffused, and are exhausted without participating in the deposition of the film. On the other hand, formula 3 indicates that $SiH_3$ radicals remaining unchanged without reacting with parent molecules reach the substrate 12, to contribute selectively to the deposition of the thin film, for providing a high quality thin film.

On the other hand, it is feared that since the production of $SiH_2$ radicals continue in the plasma localized inside the second gas exhaust holes 19 of the earth cover plate 8 and inside the gas exhaust holes 17 of the discharge electrode plate 3, high order silane-related species are produced according to formulae 1 and 2. These reactions are third-body reactions where extra energy is absorbed by the third body (usually $SiH_4$ acting as parent molecules), to stabilize the product as described above. Consequently, if a heating mechanism 21 (see FIG. 4) is installed in the earth cover plate 8, to effectively heat the plasma localized inside the gas exhaust holes 17 and the second gas exhaust holes 19 considered to generate the highest order radicals, the progress of the third-body reactions can be inhibited.

A second embodiment of the present invention is described below.

Figure 5:
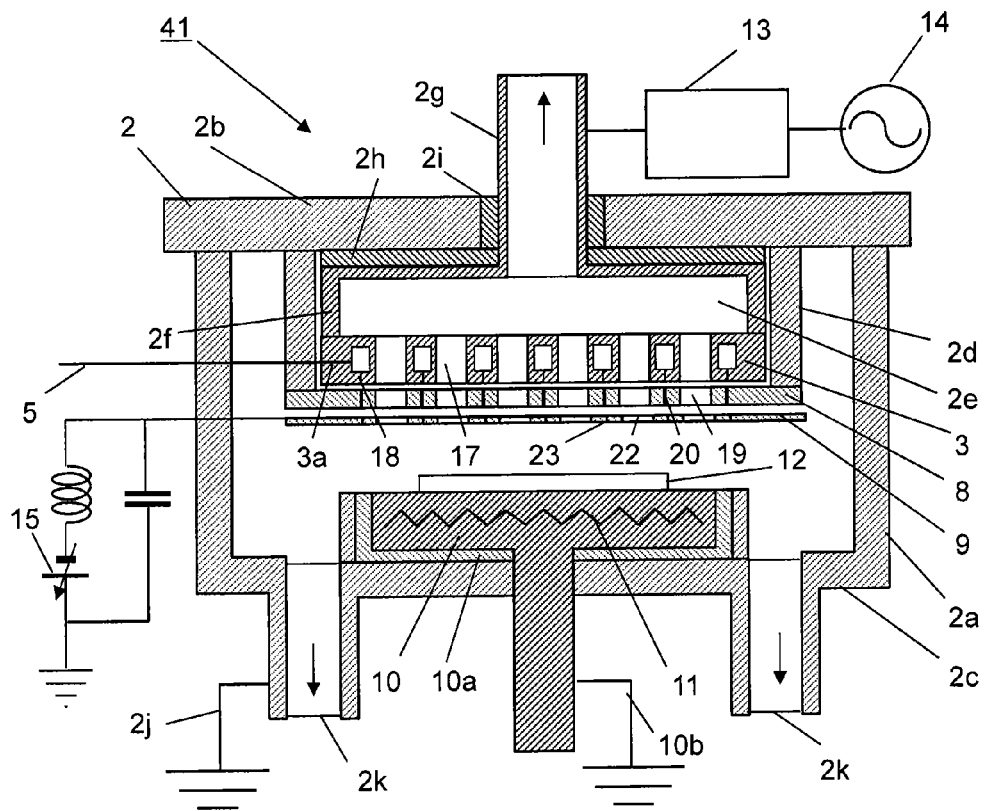
FIG. 5 is a schematic vertical sectional view showing another embodiment (second embodiment) of the plasma CVD device of the invention.

FIG. 5 shows an example of a second embodiment of the plasma CVD device of the invention. The plasma CVD device 41 shown in FIG. 5 is identical to the plasma CVD device 1 shown in FIG. 1, except that a potential control plate 9 provided with a power supply for keeping the potential constant is installed between the earth cover plate 8 and the earth electrode plate 10.

Figure 6:
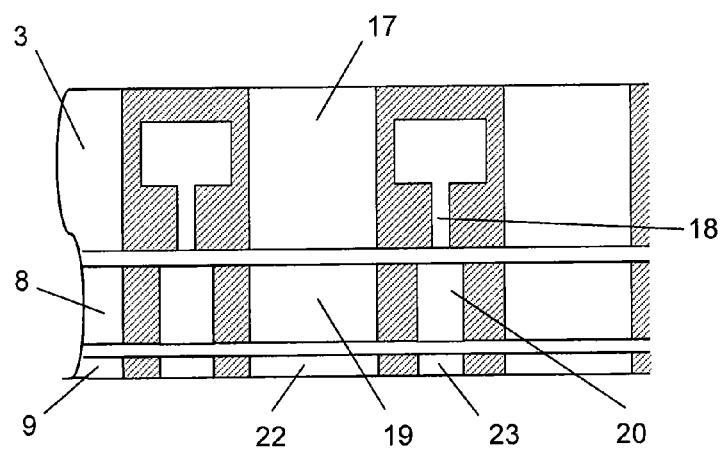
FIG. 6 is a partially enlarged vertical sectional view showing the discharge electrode, the earth cover plate and the potential control plate of the plasma CVD device shown in FIG. 5.

The components forming the plasma CVD device 41 shown in FIG. 5 other than the components relating to the potential control plate 9 are the same as those forming the plasma CVD device 1 shown in FIG. 1. Therefore, in the plasma CVD device 41 shown in FIG. 5, the same components as those of the plasma CVD device 1 shown in FIG. 1 are given the same symbols as those used in FIG. 1. FIG. 6 is a partially enlarged vertical sectional view showing the discharge electrode plate 3, the earth cover plate 8 and the potential control plate 9 of the plasma CVD device 41 shown in FIG. 5

In the plasma CVD device 41 shown in FIG. 5, the potential control plate 9 that is earthed is installed between the earth cover plate 8 and the earth electrode plate 10. The potential control plate 9 and the earth cover plate 8 face each other with a clearance kept therebetween. The potential control plate 9 and the earth electrode plate 10 also face each other with a clearance kept therebetween.

The potential control plate 9 has numerous third gas introduction holes 23 formed therein at the positions facing the gas introduction holes 18 of the discharge electrode plate 3 and the second gas introduction holes 20 of the earth cover plate. The potential control plate 9 further has numerous third gas exhaust holes 22 formed therein at the positions facing the gas exhaust holes 17 of the discharge electrode plate 3 and the second gas exhaust holes 19 of the earth cover plate. Both the third gas introduction holes 23 and the third gas exhaust holes 22 pass through the potential control plate 9 in the thickness direction thereof. The potential control plate 9 is connected with a power supply 15 capable of controlling the potential applied to the potential control plate 9.

The power supply 15 is able to apply a potential to the potential control plate 9 and to allow the potential to be controlled. It can be a DC variable power supply or an AC power supply of the KHz order in frequency capable of generating self-bias for applying a DC potential or even an AC power supply of KHz level or a high frequency power supply.

In the case where there is no potential control plate 9, the confinement of the plasma in the second gas exhaust holes 19 can be controlled by the thickness of the earth cover plate 8. That is, the earth area capable of supplying sufficient electrons to the plasma localized in the second gas exhaust holes 19 is preferred. Consequently if it is attempted to confine the plasma in the holes as far as possible, it is preferable to enlarge the area of the inner wall faces of the second gas exhaust holes 19. As a result, it is preferable to increase the is thickness of the earth cover plate 8.

However, if the thickness of the earth cover plate 8 is increased, the opening rate toward the substrate 12 from the plasma decreases and the radicals released from the second gas exhaust holes 19 decrease to remarkably lower the depositing rate. It was found that this problem can be solved by installing the potential control plate 9 below the earth cover plate 8 and applying a negative potential to the potential control plate 9. If the potential control plate 9 is installed, the plasma can be confined in the second gas exhaust holes 19 without lowering the depositing rate.

EXAMPLE 1

A substrate 12 made of single-crystalline silicon for forming a thin film thereon was mounted on the upper surface of the earth electrode plate 10 of the plasma CVD device 1 shown in FIG. 1. A high frequency power supply 14 of 60 MHz was connected with the discharge electrode plate 3 via the matching box 13.

The diameter of the gas exhaust holes 17 formed in the discharge electrode plate 3 was set at 10 mm, and the clearance between the discharge electrode plate 3 and the earth cover plate 8 was set at 0.8 mm. Further, the diameter of the second gas exhaust holes 19 formed in the earth cover plate 8 was set at 10 mm, and the diameter of the second gas introduction holes 20 was set at 2 mm. The thickness of the earth cover plate 8 was set at 10 mm.

The temperature of the heating mechanism (heater) 11 installed in the earth electrode plate 10 was set at 250° C., and the temperature of the earth cover plate 8 was set at 200° C. by the heating mechanism (heater) 21 installed in the earth cover plate 8. In this state, the temperature of the surface of the substrate 12 was measured and found to be 217° C.

Gas in the vacuum vessel 2 was let out through the exhaust ports 2k formed in the bottom surface of the vacuum vessel 2 till the pressure in the vacuum vessel 2 reached $1\times10^{-4}$ Pa.

Subsequently, SiH$_4$ gas (raw gas) was introduced into the numerous gas introduction holes 18 formed in the discharge electrode plate 3 through the raw gas supply hole 3a from the raw gas supply pipe 5 at a flow rate of 50 sccm by a mass flow controller, and the exhaust route from the gas exhaust conduit 2g was used to exhaust gas in the vacuum vessel 2 through the numerous second gas exhaust holes 19 formed in the earth cover plate 8 and the numerous gas exhaust holes 17 formed in the discharge electrode plate 3, to adjust the pressure in the vacuum vessel 2 to 30 Pa.

Then, a power of 30 W was supplied from the high frequency power supply 14 to the discharge electrode plate 3, to generate plasma, for forming an amorphous silicon thin film on the substrate 12.

EXAMPLE 2

An amorphous silicon thin film was formed on the substrate 12 under the same conditions as those of Example 1, except that the flow rate of the raw gas was changed to 100 sccm.

EXAMPLE 3

A substrate 12 made of single-crystalline silicon for forming a thin film thereon was mounted on the upper surface of the earth electrode plate 10 of the plasma CVD device shown in FIG. 5. A high frequency power supply 14 of 60 MHz was connected with the discharge electrode plate 3 via the matching box 13. Further, a DC power supply 15 was connected with the potential control plate 9 installed with a clearance kept from the earth cover plate 8.

The diameter of the gas exhaust holes 17 formed in the discharge electrode plate 3 was set at 10 mm, and the clearance between the discharge electrode plate 3 and the earth cover plate 8 was set at 0.8 mm. Further, the diameter of the second gas exhaust holes 19 formed in the earth cover plate 8 was set at 10 mm, and the diameter of the second gas introduction holes 20 was set at 2 mm. The diameter of the third gas exhaust holes 22 formed in the potential control plate 9 was set at 10 mm, and the diameter of the third gas introduction holes 23 was set at 2 mm. The thickness of the earth cover plate 8 was set at 10 mm, and the thickness of the potential control plate 9 was set at 1 mm.

The temperature of the heating mechanism (heater) 11 installed in the earth electrode plate 10 was set at 250° C., and the temperature of the earth cover plate 8 was set at 200° C. by the heating mechanism (heater) 21 installed in the earth cover plate 8.

Gas in the vacuum vessel 2 was let out through the exhaust ports 2k formed in the bottom surface of the vacuum vessel 2 till the pressure in the vacuum vessel 2 reached $1\times10^{4}$ Pa.

Subsequently SiH$_4$ gas (raw gas) was introduced into the numerous gas introduction holes 18 formed in the discharge electrode plate 3 through the raw gas supply hole 3a from the raw gas supply pipe 5 at a flow rate of 50 sccm by a mass flow controller, and the exhaust route from the gas exhaust conduit 2g was used to exhaust gas in the vacuum vessel 2 through the numerous third gas exhaust holes 22 formed in the potential control plate 9, the numerous second gas exhaust holes 19 formed in the earth cover plate 8 and the numerous gas exhaust holes 17 formed in the discharge electrode plate 3, to adjust the pressure in the vacuum vessel 2 to 25 Pa.

Then, a potential of −15 V was applied to the potential control plate 9 by using the power supply 15. Further, a power of 30 W was supplied from the high frequency power supply 14 to the discharge electrode plate 3, to generate plasma, for forming an amorphous silicon thin film on the substrate 12.

COMPARATIVE EXAMPLE 1

Figure 7:
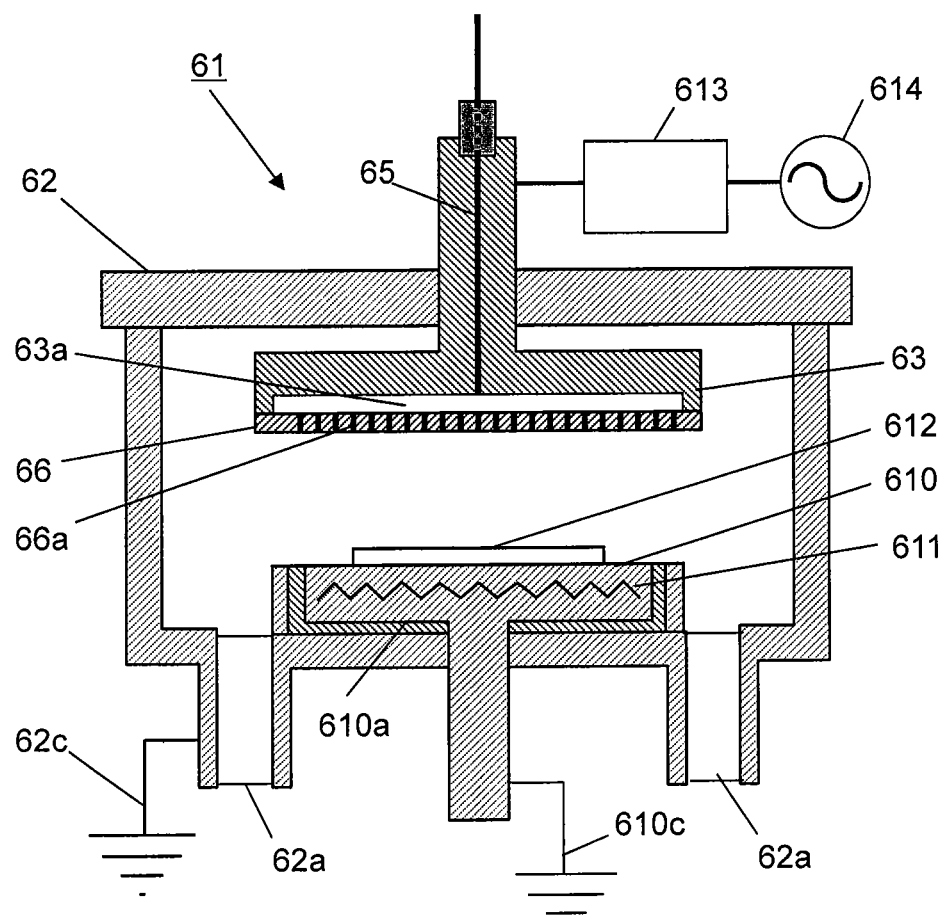
FIG. 7 is a schematic vertical sectional view showing an example of the conventional plasma CVD device.
Figure 8:
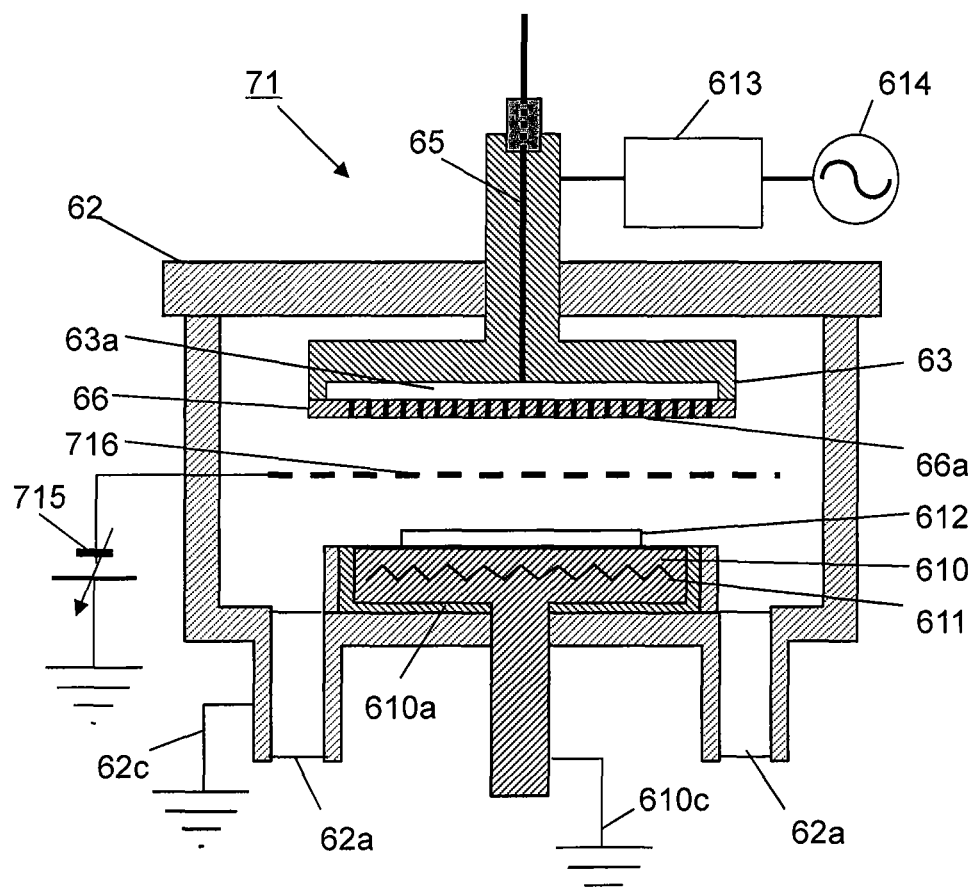
FIG. 8 is a schematic vertical sectional view showing an example of the conventional CVD device using a triode deposition system.

A substrate 612 made of single-crystalline silicon for forming a thin film thereon was mounted on the upper surface of the earth electrode plate 610 of the conventional plasma CVD device 61 shown in FIG. 7. A high frequency power supply 614 of 60 MHz was connected via the matching box 613 with the discharge electrode plate 63. The temperature of the heating mechanism (heater) 611 of the earth electrode plate 610 was set at 270° C. In this state, the temperature of the surface of the substrate 612 mounted on the earth electrode plate 610 was measured and found to be 230° C.

Gas in the vacuum vessel 62 was let out through the exhaust ports 62a formed in the bottom surface of the vacuum vessel 62 till the pressure in the vacuum vessel 62 reached $1\times10^{-4}$ Pa, to keep the inside of the vacuum vessel 62 substantially in a vacuum state.

Subsequently SiH$_4$ gas (raw gas) was introduced into the vacuum vessel 62 through the numerous gas introduction holes 66a formed in the shower plate 66 from the raw gas supply pipe 65 at a flow rate of 50 sccm by a mass flow controller, and gas in the vacuum vessel 62 was let out from the exhaust ports 62a formed in the bottom surface of the vacuum vessel 62, to adjust the pressure in the vacuum vessel 62 to 10 Pa.

Then, a power of 30 W was supplied to the discharge electrode plate 63 from the high frequency power supply 614, to generate plasma, for forming an amorphous silicon thin film on the substrate 612.

The Si—H$_2$ bond concentrations in the amorphous silicon thin films obtained in Examples 1 to 3 were determined by using a Fourier transform infrared spectrometer (FT/IR-6100 produced by JASCO Corporation), and the results are shown in Table 1.

TABLE 1

|  | Si—H$_2$ bond concentration (at. %) |
|---|---|
| Example 1 | 0.56 |
| Example 2 | 0.41 |
| Example 3 | 0.22 |
| Comparative Example 1 | 3.34 |

It can be seen that in Example 1, even though the temperature of the substrate 12 was as relatively low as 217° C., the Si—H$_2$ bond concentration in the film was lower than 1 at %, and that in Example 2, since the gas flow rate was raised to enhance the flow velocity of plasma in the exhaust holes, a low Si—H$_2$ bond concentration was obtained.

It can be seen that in Example 3, a further lower Si—H$_2$ bond concentration than that of Example 1 was obtained by applying a negative potential to the potential control plate 9, to confine plasma.

It can be seen that, as described above, if an embodiment of the plasma CVD device of the invention is used to form a silicon thin film, the obtained silicon thin film is smaller in the ingress of high order silane-related species, being a high quality thin film having less defects than the silicon thin film formed by the conventional parallel-plates type plasma CVD device. If the high quality amorphous silicon thin film is used for solar cells, solar cells having little light-induced degradation and high conversion efficiency can be manufactured.

Embodiments of the plasma CVD device of the invention can be used not only for manufacturing amorphous silicon thin films but also for manufacturing various thin films such as microcrystalline silicon thin films. Further, embodiments of the plasma CVD device of the invention can also be used as an etching device and a plasma surface treatment device.

REFERENCE NUMBERS 1 plasma CVD device
2 vacuum vessel
2a side plate
2b top plate
2c bottom plate
2d interior side plate
2e hollow portion
2f gas exhaust cap
2g gas exhaust conduit
2h electric insulator
2i electric insulator
2j conductor
2k exhaust port
3 discharge electrode plate
3a raw gas supply hole
5 raw gas supply pipe
8 earth cover plate
9 potential control plate
10 earth electrode plate
10a electric insulator
10b conductor
11 substrate heating mechanism
12 substrate
13 matching box
14 high frequency power supply
15 power supply
17 numerous gas exhaust holes
18 numerous gas introduction holes
19 numerous second gas exhaust holes
20 numerous second gas introduction holes
21 heating mechanism
22 numerous third gas exhaust holes
23 numerous third gas introduction holes
41 plasma CVD device
61 plasma CVD device
62 vacuum vessel
62a exhaust port
63 discharge electrode plate
63a hollow portion
65 raw gas supply pipe
66 shower plate
66a numerous gas introduction holes

The invention claimed is:
1. A plasma CVD device comprising
  (a) a vacuum vessel,
  (b) an exhaust equipment for keeping the inside of the vacuum vessel under reduced pressure,
  (c) a discharge electrode plate installed in the vacuum vessel,
  (d) an earth electrode plate for supporting a substrate for forming a thin film thereon, installed to face the discharge electrode plate with a clearance kept therefrom,
  (e) a high frequency power supply for applying a high frequency power to the discharge electrode plate, and
  (f) a raw gas supply equipment for supplying a raw gas for forming the thin film into the vacuum vessel,
which comprises
  (g) a plurality of gas introduction holes formed in the discharge electrode plate, connected on one side with the gas supply equipment and opening on the other side at plural places on one surface of the discharge electrode plate, and a plurality of gas exhaust holes formed in the discharge electrode plate and passing therethrough from the surface where the plurality of gas introduction holes open, to the surface of the other side,
  (h) a gas exhaust equipment for exhausting the gas exhausted from the plurality of gas exhaust holes to outside the vacuum vessel,
  (i) an earth cover plate installed between the discharge electrode plate and the earth electrode plate with clearances kept from the respective electrode plates, and
  (j) a plurality of second gas introduction holes formed through the earth cover plate at the positions of the earth cover plate corresponding to the plurality of gas introduction holes and a plurality of second gas exhaust holes formed through the earth cover plate at the positions in the earth cover plate corresponding to the plurality of exhaust holes, wherein the plurality of gas introduction holes formed in the discharge electrode plate and the earth cover plate permits the raw gas to pass therethrough prior to ingress into the gas exhaust holes formed in the discharge electrode plate and the earth cover plate.

2. The plasma CVD device according to claim 1, wherein the diameter of the gas exhaust holes is 2 mm to 100 mm.

3. The plasma CVD device according to claim 1, wherein the clearance between the discharge electrode plate and the earth cover plate is 0.5 mm to 10 mm.

4. The plasma CVD device according to claim 1, wherein the diameter of the second gas exhaust holes is 0.5 to 1.5 times the diameter of the gas exhaust holes.

5. The plasma CVD device according to claim 1, wherein the diameter of the second gas introduction holes is 7 mm or less in so far as the flow of the gas in the second introduction holes is not prevented.

6. The plasma CVD device according to claim 1, wherein the earth cover plate is earthed.

7. The plasma CVD device according to claim 1, wherein the earth cover plate is provided with a heating mechanism.

8. The plasma CVD device according to claim 1, wherein a potential control plate capable of controlling the potential is installed between the earth cover plate and the earth electrode plate with clearances kept from the respective plates, and a plurality of third gas introduction holes positioned in correspondence to the plurality of second gas introduction holes and a plurality of third gas exhaust holes positioned in correspondence to the plurality of second gas exhaust holes are formed in the potential control plate, to pass through the potential control plate.

9. The plasma CVD device according to claim 8, wherein the potential applied to the potential control plate is a negative potential.

\* \* \* \* \*